United States Patent [19]

Usuki et al.

[11] Patent Number: 5,006,738
[45] Date of Patent: Apr. 9, 1991

[54] DELAY CIRCUIT FOR INTEGRATED CIRCUIT

[75] Inventors: Hideki Usuki; Shumpei Kohri; Masatoshi Yano; Hiroshi Ishida, all of Kanagawa, Japan

[73] Assignee: Sony Corporation, Tokyo, Japan

[21] Appl. No.: 537,868

[22] Filed: Jun. 13, 1990

Related U.S. Application Data

[63] Continuation of Ser. No. 263,389, Oct. 27, 1988, abandoned.

[30] Foreign Application Priority Data

Oct. 31, 1987 [JP] Japan .................................. 62-276874

[51] Int. Cl.$^5$ .............................................. H03K 5/13
[52] U.S. Cl. .................................... 307/594; 307/585; 307/597; 307/605
[58] Field of Search .................. 307/602–606, 307/279, 451, 481, 585, 590, 594, 595, 597, 273.2, 246; 330/288, 257; 323/315

[56] References Cited

U.S. PATENT DOCUMENTS

| T926,003 | 9/1974 | Nomiya et al. ............ 307/481 |
| 3,895,239 | 7/1975 | Alaspa ...................... 307/272.3 |
| 3,937,982 | 2/1976 | Nakajima .................. 307/481 |
| 4,424,456 | 1/1984 | Shiraki et al. .............. 307/451 |
| 4,499,387 | 2/1985 | Konishi ..................... 307/451 |
| 4,644,182 | 2/1987 | Kawashima et al. ........ 307/605 |
| 4,752,703 | 6/1988 | Lin ........................... 307/451 |
| 4,812,687 | 3/1989 | Larson et al. ............. 307/290 |
| 4,835,489 | 5/1989 | Monticelli ................. 330/288 |

OTHER PUBLICATIONS

IBM Tech. Disc. Bult., Hanafi, Delay Driver Circuit, Jan. '81, p. 3610.
IBM Tech. Disc. Bult., Sonoda, MOSFET Powering Circuit, Feb. '71, p. 2658.
"Electronics Engineers' Handbook"; editor; Fink, Donald; McGraw-Hill Book Company, Second Edition, pp. (16-16)–(16-19).

*Primary Examiner*—Stanley D. Miller
*Assistant Examiner*—T. Cunningham
*Attorney, Agent, or Firm*—Hill, Van Santen, Steadman & Simpson

[57] ABSTRACT

A delay circuit for integrated circuits includes a current mirror circuit having at least a pair of MIS transistors, a constant current source and a capacitance. The delay time is determined by the charging time of the capacitance connected to one of the MIS transistors. A stable delay time is obtained regardless of manufacturing variations and the space required for the circuit is reduced.

15 Claims, 3 Drawing Sheets

DELAY CIRCUIT FOR INTEGRATED CIRCUIT

This is a continuation of application Ser. No. 263,389, filed Oct. 27, 1988, and now abandoned.

BACKGROUND OF THE INVENTION

1. Field of the Invention

This invention relates to a delay circuit for producing a certain delay time and more particularly to an improved a delay circuit for integrated circuits, such as CMOS circuits.

2. Description of the Related Art

In certain memory devices, data signals are latched at the outputs thereof after the address signals are applied, and then the memory cells are in the stand-by state to reduce the power consumption (PWL system; pulsed word line system). In such memory devices, a delay circuit is used since a waiting time of one cycle is needed.

FIGS. 4 and 5 show an example of the prior art delay circuit for use in such memory devices. FIG. 4 shows the basic construction of the conventional delay circuit wherein a capacitance 42, such as a MOS capacitor, is connected to the output side of an inverter circuit 41. FIG. 5 shows a circuit for obtaining a longer delay time. The circuit has a plurality of inverter circuits 51 through 54 with capacitors 55 through 58 provided following each of the inverter circuits. In the delay circuit having the above construction, the input/output inverting operation is performed when the threshold voltage of each inverter is exceeded so that the capacitors 55–58 are charged gradually. The similar operation takes place when the voltage value at the capacitors 55–58 exceeds the threshold voltage of the next stage inverter circuit.

FIG. 6 is a waveform diagram showing output signals of the conventional delay circuits employing one or more inverter circuits. When the inverter circuit is formed by a CMOS inverter, a waveform PA is obtained. The waveform PA starts to rise at the time $\tau_1$ and exceeds the threshold voltage Vth of the next stage at time $\tau_2$. At this time, $\tau_2$ the waveform PA presents a curve that is upwardly convex due to the drive capability of the PMOS transistor in the inverter such that the voltage PA approaches the source voltage Vcc gradually.

However, the above delay circuit is subject to performance differences due to manufacturing variations. For example, when the channel length of the transistor making up the inverter circuit varies, the threshold voltage Vth is changed, with a resulting increase or decrease in the delay time. When a longer delay time is desired, the number of stages is increased correspondingly. The result is that the space required for the additional circuitry is increased in an amount corresponding to the increased number of the circuits, such as the inverter circuits. The delay time is set by the time between $\tau_1$ and $\tau_2$ ($\tau_2-\tau_1$) in FIG. 6 as the reference. However, the waveform PA rises exponentially so that it is difficult to set the exact delay time. In addition, the performance differences of the circuits making up the multiple stage embodiment are added to one another to make the delay time is even less exact.

SUMMARY OF THE INVENTION

It is therefore an object of this invention to provide a delay circuit having a stable and exactly determinable delay time which may be extended without increasing the complexity of the circuit. It is a further object of this invention to provide a delay circuit which reduces the space required for the delay circuitry.

According to one embodiment of the invention, an improved delay circuit for integrated circuits is provided in a complementary MIS (metal-insulated-semiconductor) structure. The delay circuit includes a pair of current mirror connected MIS transistors, a constant current source and a capacitance. The constant current source is connected to one of the MIS transistors in order to determine the current through the MIS transistor. The capacitance is connected to the other of the MIS transistors which serves as a current path. The delay time is determined by the charging time of the capacitance. The quantity of current provided to charge the capacitance is dependent on the ratio of the current capability or Q factor of the pair of the MIS transistors.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows read in conjunction with the accompanying drawings, wherein:

DESCRIPTION OF THE PREFERRED EMBODIMENTS

Figure 1:
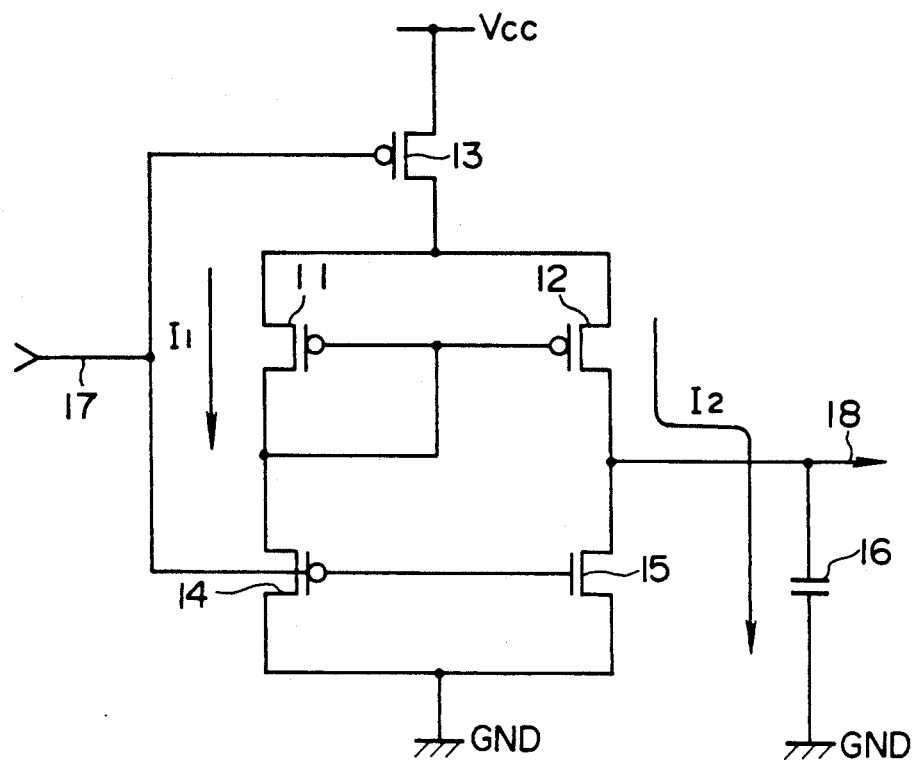
FIG. 1 is a circuit diagram showing an example of the delay circuit of the present invention.

Preferred embodiments of the present invention will be explained by referring to the drawings.

The first embodiment has a circuit construction of the present invention is shown in FIG. 1. A pair of PMOS transistors (p-channel MOSFETs) 11, 12 are connected in a gate common configuration so as to constitute a current mirror circuit. The common connected gate is connected to the drain side of the PMOS transistor 11. The respective sources of the pair of PMOS transistors 11, 12 are connected to a PMOS transistor 13 connected in common and acting as a switch. The transistor 13 has its source connected to a source voltage Vcc. A PMOS transistor 14 as a constant current source is connected to a drain of the PMOS transistor 11. The PMOS transistor 14 has its drain connected to ground GND and input signals are supplied to the gate via input 17. The PMOS transistor 12 has its drain connected to a capacitor 16 for storing the electrical charges and a NMOS transistor (n-channel MOSFET) 15 for controlling the charging and discharging of the capacitor 16. The NMOS transistor 15 has its gate connected in common with the gate of the PMOS transistor 14 to the input 17. The NMOS transistor 15 has its source connected to a ground voltage GND. The electrode of the capacitor 16 connected to the drain of the PMOS transistor 12 is connected to the output 18. The other electrode of the capacitor 16 is connected to a ground voltage GND. In the first embodiment, the PMOS transistor 13 may be dispensed with. The capacitor 16 may also be a gate capacitance of a MOS transistor.

The delay circuit of the first embodiment having the above circuit construction operates in the following manner. The input signal is set to "H" (high) level at first. At this time, the PMOS transistors 13, 14 are both turned off. The NMOS transistor 15 is simultaneously turned on. The capacitor 16 has its both ends connected to the ground voltage GND and is reset. Therefore, the output signal of the delay circuit is at "L" (low) level. Next, the input signal is then changed from the "H" to the "L" level. This causes the NMOS transistor 15 to be turned off and both the PMOS transistors 13, 14 to be turned on. With the PMOS transistors 13, 14 both turned on, current $I_1$ flows in the transistors 13, 11, and 14. This current $I_1$ is determined by the PMOS transistor 14 as the constant current source and more specifically the size of the PMOS transistor 14, threshold voltage Vth, etc. The current $I_1$ flowing in the PMOS transistor 11 also determines the current $I_2$ of the PMOS transistor 12 since the PMOS transistors 11 and 12 are connected is a current mirror configuration. The value of the current $I_2$ is given by the formula;

$$I_2 = I_1 \times (Q_1/Q_1) \ldots \quad (1)$$

(where $Q_2$, $Q_1$ are current capabilities or Q factors of the PMOS transistors 12 and 11, respectively.)

The current $I_2$ flowing in the PMOS transistor 12 having its value determined by the PMOS transistors 11, 13 flows into the capacitor 16, since the NMOS transistor 15 is turned off. The current $I_2$ charging capacity 16 has a constant current value and gives a constant charging time.

Figure 2:
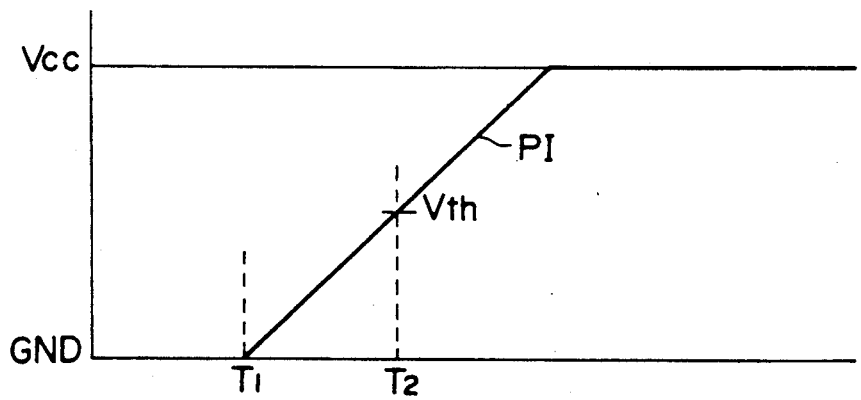
FIG. 2 is a waveform diagram showing the output signals.

FIG. 2 shows the voltage rise in the capacitor 16 caused by the current $I_2$, that is, the waveform PI of the output signals. In FIG. 2, the waveform PI rises substantially linearly from time $T_1$, and exceeds the next stage threshold voltage Vth at time $T_2$. When the next stage threshold voltage Vth is exceeded, delayed output signals of the delay circuit with respect to the input signals are obtained. Plural similar delay circuit stages may be provided following the circuit of FIG. 1 as the next stage and a waveform shaping circuit may also be provided.

In the delay circuit of the first embodiment with the above operation, in order that the PMOS transistor 14 operates ideally as the constant current source, it suffices that the current capability $Q_1$ of the PMOS transistor 11 be sufficiently larger than the current capability of $Q_3$ of the PMOS transistor 14. For obtaining a long delay time, it is necessary that a small current $I_2$ flows in the PMOS transistor 12, so that the current capability of the PMOS transistor 11 should be sufficiently larger than that of the PMOS transistor 12. These current capabilities $Q_1$, to $Q_3$ are determined by manufacturing parameters (such as channel lengths and widths, concentration of impurities, etc.). These parameters, if changed for manufacturing reasons, are changed uniformly. Therefore, the ratio of the current capabilities is not affected by manufacturing fluctuations. Therefore, the delay circuit is relatively immune to manufacturing fluctuations. For example, the fluctuations of the current $I_1$ are suppressed by increasing the channel length of the PMOS transistor 14. Since the relation of the PMOS transistors 11 and 12 is kept constant, the delay time of the delay circuit of the first embodiment is not affected by fluctuations in the channel length.

Figure 6:
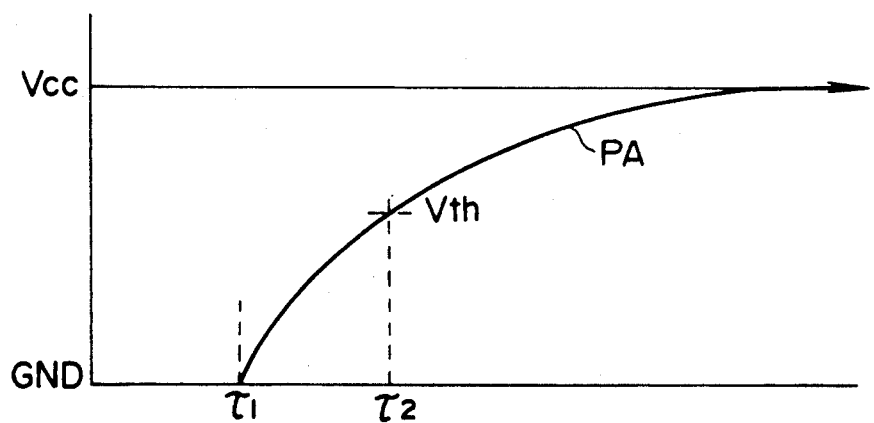
FIG. 6 is a wave form diagram showing output signals of the conventional delay circuit.

In the delay circuit of the first embodiment, as shown in FIG. 2, the output signals are changed substantially linearly, so that the delay time can be set easily. That is, the time difference between the time $T_2$ and time $T_1$ can be set with less error as compared with the exponential type circuit (see FIG. 6). Thus, a stable and readily determinable delay time can be achieved. Longer delay time can also be obtained by increasing the capacitance of the capacitor 16. However, a longer delay time can be obtained easily by setting the ratio between the current capabilities $Q_1$ and $Q_2$ so as to be larger. Hence, an extremely small capacitor 16 suffices and the space occupied by the circuit can be reduced.

In the delay circuit of the second embodiment, the constant current source is constituted by a NMOS transistor to elevate the NMOS transistor dependency of the circuit.

Figure 3:
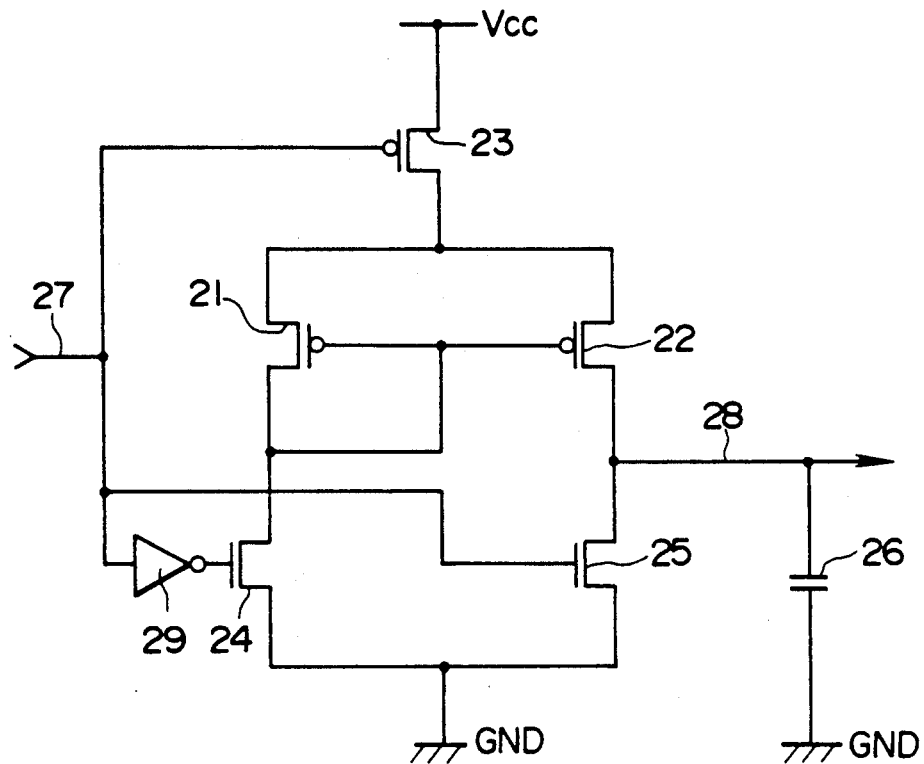
FIG. 3 is a circuit diagram showing another example of the delay circuit of the present invention.
Figure 4:
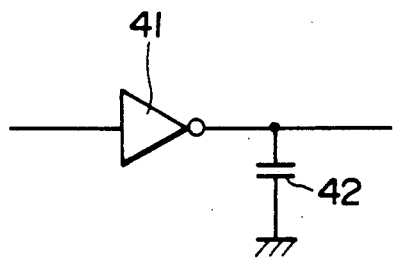
FIG. 4 is a circuit diagram showing an example of the conventional delay circuit.
Figure 5:
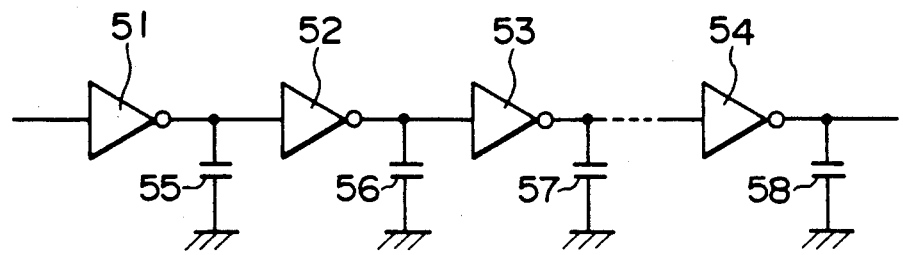
FIG. 5 is a circuit diagram showing another example of a conventional delay circuit.

The delay circuit of the second embodiment has the structure as shown in FIG. 3. Similar to the delay circuit of the first embodiment, a pair of PMOS transistors 21 and 22 are connected in a gate common configuration to form a current mirror circuit. The common connected gates are connected to the drain side of the PMOS transistor 21. The paired PMOS transistors 21 and 22 have the sources connected in common and connected to a PMOS transistor 23 acting as a switch. The PMOS transistor 23 has its source connected to a source voltage Vcc. A NMOS transistor 24 as a constant current source is connected to a drain of the PMOS transistor 21. The NMOS transistor 24 has its source connected to a ground voltage GND and the input signals are supplied from the input 27 via an inverter circuit 29. A NMOS transistor 25 for controlling the charging and discharging of the capacitor 26 is connected to the drain of the PMOS transistor 22. To the gate of the NMOS transistor 25 are applied input signals from the input 27. The source of the NMOS transistor 25 is connected to the ground voltage GND. The electrode of the capacitor 26 connected to the drain side of the PMOS transistor 22 is connected to an output 28 supplying output signals. The other electrode of the capacitor 26 is connected to the ground voltage GND.

In the second embodiment, the PMOS transistor 23 may be dispensed with. The capacitor 26 may be the gate capacitance etc. of the MOS transistor.

The operation of the delay circuit of the second embodiment having the above circuit configuration is substantially the same as that of the delay circuit of the first embodiment, the only difference being that the NMOS transistor 24 is used as the PMOS transistor 14 of the constant current source.

That is, when the input signal is changed from "H" level to "L" level, the NMOS transistor 25 is turned from the ON state to the OFF state, for releasing the reset state of the capacity 26. Simultaneously, the NMOS transistor 24 is turned to the ON state from the OFF state. The current value $I_1'$ of the PMOS transistor 21 can be determined by rendering the current capability $Q_3'$ of the NMOS transistor 24 substantially less than the current capability $Q_1'$ of the PMOS transistor 21. The relation of the equation (1) in the first embodiment holds true between the current mirror connected PMOS transistor 21 and 22. Therefore, the amount of the current flowing into the capacitor 26 is determined by the NMOS transistor 24.

In general, numerous NMOS transistors are formed in a memory cell of an integrated circuit and represent main factors in determining the operational timing. Therefore, NMOS transistor dependency of the circuit may be provided by using the NMOS transistor 24 as the constant current source. For example, when the NMOS transistor element is slightly faster than the design value, the tendency is reflected on the delay circuit. Similar to the delay circuit of the first embodiment, the manufacturing parameters, if changed, are changed uniformly for the delay circuit of the second embodiment, so that the ratio of the current capabilities is not affected by the manufacturing fluctuations.

The output as shown in FIG. 2 is obtained in the delay circuit of the second embodiment and the transition is substantially linear so that error is minimized and a stable delay time may be obtained. The desired long delay time can be obtained by selecting the capacitance of the capacitor 26 to be larger, however, a longer delay time can be obtained easily by reducing the current value $I_1'$ based on the constant current source or selecting the ratio of the current capabilities of the pair of PMOS transistors 21 and 22 connected in the current mirror configuration. In this manner, the occupation space required by the capacitor 26 can be reduced substantially.

It is to be noted that plural delay circuits according to the invention may be connected together to form a delay circuit.

Although other modifications and changes may be suggested by those skilled in the art, it is the intention of the inventors to embody within the patent warranted hereon all changes and modifications as reasonably and properly come within the scope of their contribution to the art.

What we claim is:

1. A delay circuit for an integrated circuit for producing a predetermined delay time between a signal received at an input and a signal produced at an output, comprising:
    a current mirror circuit including at least a pair of current mirror connected MIS transistors, each of said MIS transistors is a PMOS transistor having their sources coupled to source voltage and both gates of said MIS transistors are connected in common;
    a constant current source connected between a drain of one of said MIS transistors and ground;
    a capacitance connected between a drain of the other of said MIS transistors and ground and being chargeable by current flowing through said other of said MIS transistors, charging time of said capacitance from the current flowing through said other of said MIS transistors determining the predetermined delay time of said delay circuit;
    said constant current source comprising a PMOS transistor, and a gate of said PMOS transistor of said constant current source being the input for receiving an input signal;
    a NMOS transistor connected to the other of said MIS transistors and in parallel with said capacitance, a gate of said NMOS transistor being connected in common with a gate of said PMOS transistor of said constant current source so that said NMOS transistor switches to a conducting state when said PMOS transistor is in a non-conducting state and visa versa.

2. A delay circuit for producing a predetermined delay time for an integrated circuit, comprising:
    a current mirror circuit including at least a pair of current mirror connected MIS transistors, each of said MIS Transistors being a PMOS transistor having their sources coupled to a source voltage and both gates of said MIS transistors being connected in common;
    a constant current source connected between a drain of one of said MIS transistors and ground;
    a capacitance connected between a drain of the other of said MIS transistors and ground and being chargeable by current flowing through said other of said MIS transistors, charging time of said capacitance from said current flowing through said other of said MIS transistors determining said predetermined delay time of said delay circuit;
    said constant current source comprising a first NMOS transistor;
    a second NMOS transistors connected to said other of said MIS transistors and in parallel with said capacitance, a gate of said second NMOS transistor being connected to receive an input signal;
    an inverter having an output connected to a gate of said first NMOS transistor, and an input connected to receive the input signal so that the input signal may be supplied to the gate of said NMOS transistor of said constant current source through said inverter to cause said first NMOS transistor to be switched to a conducting state when said second NMOS transistor is in a non-conducting state and visa-versa.

3. A delay circuit according to claim 1, wherein said capacitance is a MOS capacitor.

4. A delay circuit according to claim 1, wherein a current capability of one of said MIS transistors is different from a current capability of said other of said MIS transistors.

5. A delay circuit according to claim 2, wherein said capacitance is a MOS capacitor.

6. A delay circuit according to claim 2, wherein a current capability of one of said MIS transistors is different from a current capability of said other of said MIS transistors.

7. A delay circuit for an integrated circuit, comprising:
    first and second transistors each with a gate, a source and a drain, said sources of said first and second transistors being connected together and coupled to a source voltage and said gates of said first and second transistors being connected together and to said drain of said first transistor to form a current mirror circuit;
    a constant current source connected between said drain of said first transistor and ground so that a first current flowing through said first transistor flows through said constant current source;
    a capacitance connected between said drain of said second transistor and ground to receive a second current flowing through said second transistor to charge said capacitance to a threshold level in a predetermined time interval;
    an output of said delay circuit being across said capacitance so that a delay time of said delay circuit is said predetermined time interval; and
    a switch connected in parallel across said capacitance to selectively discharge said capacitance.

8. A delay circuit as claimed in claim 7, wherein said constant current source comprises a third transistor having a gate coupled to receive an input signal to said delay circuit, said input signal causing switching of said third transistor, and wherein said switch comprises a fourth transistor having a gate coupled to receive the input signal to said delay circuit, said input signal causing switching of said third transistor, said third and fourth transistors being switchable opposite one another.

9. A delay circuit as claimed in claim 8, wherein one of said third and fourth transistors is an NMOS transistor and another of said third and fourth transistors is a PMOS transistor.

10. A delay circuit as claimed in claim 8, further comprising:

an inverter connected between the input of said delay circuit and said gate of one of said third and fourth transistors.

11. A delay circuit as claimed in claim 7, wherein said first and second transistors are PMOS transistors and said switch is an NMOS transistor with a gate coupled to the input of the delay circuit.

12. A delay circuit as claimed in claim 11, wherein said constant current source is a PMOS transistor.

13. A delay circuit as claimed in claim 11, wherein said constant current source is an NMOS transistor, and further comprising:

an inverter connected between a gate of said NMOS transistor of said constant current source and an input of said delay circuit.

14. A delay circuit as claimed in claim 7, further comprising:

a second switch coupling said sources of said first and second transistors and said source voltage.

15. A delay circuit as claimed in claim 14, wherein said second switch is a transistor having a gate connected to the input of said delay circuit.

* * * * *